United States Patent
Lee

(10) Patent No.: US 10,014,829 B2
(45) Date of Patent: Jul. 3, 2018

(54) NON-INVERTING AMPLIFIER CIRCUITS

(71) Applicant: Omni Design Technologies, Inc., Milpitas, CA (US)

(72) Inventor: Hae-Seung Lee, Lexington, MA (US)

(73) Assignee: OMNI DESIGN TECHNOLOGIES, INC., Mountain View, CA (US)

( * ) Notice: Subject to any disclaimer, the term of this patent is extended or adjusted under 35 U.S.C. 154(b) by 0 days.

(21) Appl. No.: 15/385,239

(22) Filed: Dec. 20, 2016

(65) Prior Publication Data
US 2017/0187333 A1    Jun. 29, 2017

Related U.S. Application Data

(60) Provisional application No. 62/387,470, filed on Dec. 23, 2015, provisional application No. 62/298,967, filed on Feb. 23, 2016.

(51) Int. Cl.
*H03F 3/45* (2006.01)
*H03F 1/22* (2006.01)
*H03F 1/34* (2006.01)

(52) U.S. Cl.
CPC .............. *H03F 1/22* (2013.01); *H03F 1/223* (2013.01); *H03F 1/34* (2013.01); *H03F 1/342* (2013.01); *H03F 3/45183* (2013.01); *H03F 3/45* (2013.01); *H03F 3/45071* (2013.01); *H03F 2203/45701* (2013.01)

(58) Field of Classification Search
CPC .... H03F 3/45; H03F 3/45179; H03F 3/45183; H03F 3/45188; H03F 1/34; H03F 3/45071; H03F 1/22; H03F 1/223; H03F 2200/294; H03F 2200/372; H03F 1/083; H03F 1/08

USPC .................................................. 330/253, 260
See application file for complete search history.

(56) References Cited

U.S. PATENT DOCUMENTS

| | | | | |
|---|---|---|---|---|
| 4,264,874 A | * | 4/1981 | Young | H03F 1/301 330/277 |
| 6,885,250 B1 | * | 4/2005 | Le | G11C 7/067 330/260 |
| 6,980,050 B2 | * | 12/2005 | Liu | H03F 3/45179 330/253 |
| 7,576,610 B2 | * | 8/2009 | Dalena | H03F 3/45183 330/260 |
| 8,766,726 B2 | * | 7/2014 | Zabroda | H03F 1/14 330/261 |
| 2002/0084855 A1 | * | 7/2002 | Kwon | H03F 1/223 330/311 |
| 2014/0043100 A1 | * | 2/2014 | Zabroda | H03F 1/14 330/277 |

* cited by examiner

*Primary Examiner* — Khanh V Nguyen
(74) *Attorney, Agent, or Firm* — Fenwick & West LLP

(57) ABSTRACT

Amplifier circuits comprising an input transistor, a load transistor, and a feedback resistor. In one example, one embodiment is directed to an amplifier circuit comprising an input transistor, a load transistor having a control terminal and a reference terminal, and a feedback transistor. The input transistor receives an input signal, the input transistor is electrically coupled to the load transistor and the feedback transistor, the control terminal of the load transistor is electrically coupled to a bias voltage, the feedback transistor is electrically coupled to the load transistor providing negative feedback, and the reference terminal of the load transistor serves as an output of the amplifier circuit.

15 Claims, 9 Drawing Sheets

NON-INVERTING AMPLIFIER CIRCUITS

CROSS-REFERENCE TO RELATED APPLICATIONS

This application claims priority under 35 U.S.C. § 119(e) to U.S. Provisional Patent Application Ser. No. 62/298,967, "Non-Inverting Amplifier Circuits," filed Feb. 23, 2016 and to U.S. Provisional Patent Application Ser. No. 62/387,470, "Non-Inverting Amplifier Circuits," filed Dec. 23, 2015.

BACKGROUND

Amplifier circuits are widely used in analog signal processing circuits. Amplifiers are commonly constructed with MOS transistors or bipolar transistors. In MOS transistors, the gate, the source, and the drain function as the control, reference, and output terminals, respectively. In bipolar transistors, the base, the emitter, and the collector function as the control, reference, and output terminals, respectively. There are three basic types of amplifiers depending on which terminal is common between the input and output of the amplifier; In MOS technologies, they are the common-source (CS) amplifier, the common-gate (CG) amplifier, and the source-follower (SF). The corresponding amplifier types in bipolar technologies are the common-emitter (CE) amplifier, the common-base (CB) amplifier, and emitter follower (EF). The CS and CE amplifiers are most widely used due to their high voltage gain and high input impedance. The CG and CB amplifiers have better frequency response due to the lack of the Miller effect, but the low input impedance makes them difficult to drive. In addition, the CS, CE, CG, and CB amplifiers have large output resistance on the order of the load resistance, which makes it difficult for them to drive resistive loads. The SF and EF are unable to provide voltage gain, and are primarily employed as buffers.

In many applications, non-inverting amplifiers are required. Although CG and CB amplifiers are non-inverting, their low input impedance typically requires an additional buffer stage such as an SF or EF, thus increasing the power consumption, noise, and area.

SUMMARY

Non-inverting amplifiers with high input impedance are desirable in variety of applications, and power consumption, area, and noise preferably are minimized for longer battery life, portability, and performance. In addition, low output resistance and high power-supply rejection are desired in these amplifiers. In view of the foregoing, various inventive embodiments disclosed herein generally relate to amplifier circuits that provide non-inverting amplification while providing high input impedance and low output impedance simultaneously.

One embodiment is directed to an amplifier circuit comprising: an input transistor; a load transistor having a control terminal and a reference terminal; and a feedback transistor. The input transistor receives an input signal, the input transistor is electrically coupled to the load transistor and the feedback transistor, the control terminal of the load transistor is electrically coupled to a bias voltage, the feedback transistor is electrically coupled to the load transistor providing negative feedback, and the reference terminal of the load transistor serves as an output of the amplifier circuit.

Another embodiment is directed to an amplifier circuit comprising: an input transistor; a load transistor having a control terminal and a reference terminal; a feedback transistor; and a current source. The input transistor receives an input signal, the input transistor is electrically coupled to the load transistor and the feedback transistor, the control terminal of the load transistor is electrically coupled to a bias voltage, the feedback transistor is electrically coupled to the load transistor providing negative feedback, and the reference terminal of the load transistor serves as an output of the amplifier circuit. The current source is electrically coupled to the input transistor so as to increase the current through the input transistor.

Another embodiment is directed to an amplifier circuit comprising: an input transistor; a load transistor having a control terminal and a reference terminal; a feedback transistor; and a level shifting circuit. The input transistor receives an input signal, the input transistor is electrically coupled to the load transistor and the feedback transistor, the control terminal of the load transistor is electrically coupled to a bias voltage, the feedback transistor is electrically coupled to the load transistor providing negative feedback, and the reference terminal of the load transistor serves as an output of the amplifier circuit. The level shifting circuit, electrically coupled to the load transistor and the feedback transistor, may be a capacitor charged to a predetermined voltage, a level shifting transistor and a current source, or resistor and a current source.

Another embodiment is directed to a differential amplifier circuit. The amplifier circuit comprises: a first input transistor; a second input transistor; at least one load transistor having a control terminal and a reference terminal; and at least one feedback transistor. The first and the second input transistors receive an input signal, the first input transistor is electrically coupled to the at least one load transistor and the at least one feedback transistor, the control terminal of the at least one load transistor is electrically coupled to a bias voltage, the at least one feedback transistor is electrically coupled to the at least one load transistor providing negative feedback. The reference terminal of the at least one load transistor serves as an output of the amplifier circuit.

Another embodiment is directed to a differential amplifier circuit. The amplifier circuit comprises: a first input transistor; a second input transistor; at least one load transistor having a control terminal and a reference terminal; at least one feedback transistor; and at least one positive feedback transistor. The first and the second input transistors receive an input signal, the first input transistor is electrically coupled to the at least one load transistor and the at least one feedback transistor, the control terminal of the at least one load transistor is electrically coupled to a bias voltage, the at least one feedback transistor is electrically coupled to the at least one load transistor providing negative feedback. The at least one positive feedback transistor is electrically coupled to the at least one load transistor to provide positive feedback. The reference terminal of the at least one load transistor serves as an output of the amplifier circuit.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Following below are more detailed descriptions of various concepts related to, and embodiments of, inventive apparatus relating to amplifier circuits. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Figure 1:
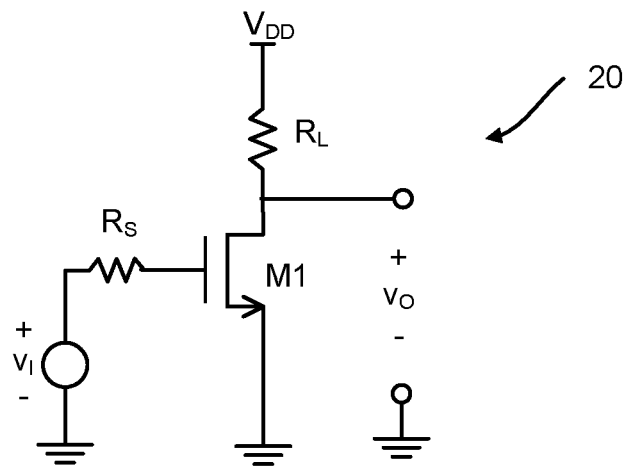
FIG. 1 (prior art) provides an illustration of a prior art common-source amplifier.

FIG. 1 provides an illustration of a prior art CS amplifier circuit 20 with a load resistor $R_L$ and a source resistance $R_S$. In this amplifier circuit, the incremental gain is shown to be:

$$a_v \approx -g_{m1} R_L \tag{1}$$

where $g_{m1}$ is the transconductance of the input transistor M1. As indicated by the minus sign, the incremental gain is negative, thus this amplifier provides inverting amplification. The input impedance at low frequencies is infinite, a desirable property for many applications.

The output resistance of the amplifier 20 is approximately the same as the load resistor $R_L$:

$$R_o \approx R_L \tag{2}$$

Therefore, the CS amplifier's gain will be reduced if any resistive load is presented at the output. For example, if load resistance $R_1$ is attached between the output and the incremental ground, the corresponding incremental gain is reduced to $$a_v \approx -g_{m1}(R_L \| R_1) \tag{3}$$

where $(R_L \| R_1)$ is the equivalent resistance of $R_L$ in parallel with $R_1$. Thus, unless $R_1$ is much larger than $R_L$, the incremental gain is substantially reduced.

Often, the power supply rejection ratio is an important consideration, especially for system-on-a-chip applications. The power supply rejection ratio (PSRR) of the amplifier in FIG. 1 is shown to be approximately same as the incremental gain because the power supply noise couples to the output without attenuation:

$$PSRR \approx g_{m1} R_L \tag{4}$$

This power supply rejection ratio is often lower than required.

Figure 2:
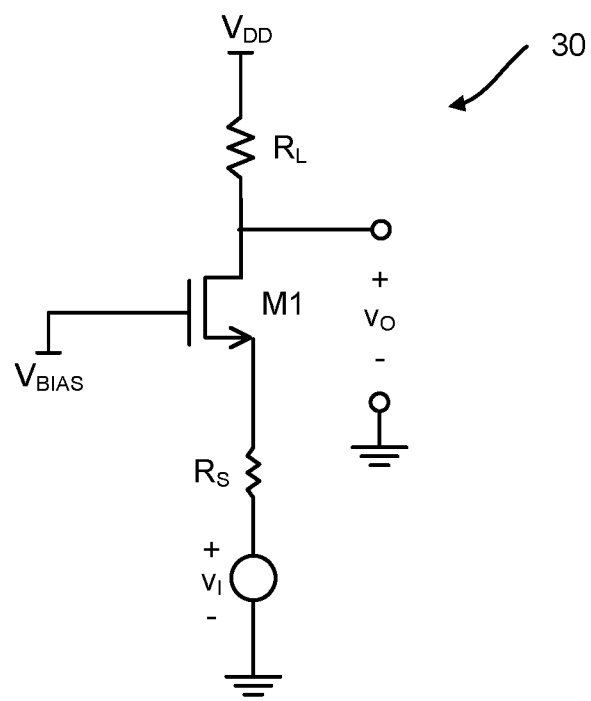
FIG. 2 (prior art) provides an illustration of a prior art common-gate amplifier.

FIG. 2 provides an illustration of a prior art CG amplifier circuit 30 with a load resistor $R_L$ and a source resistance $R_S$. In this amplifier circuit, the incremental gain is shown to be:

$$a_v \approx \frac{g_{m1} R_L}{1 + g_{m1} R_S} \tag{5}$$

where $g_{m1}$ is the transconductance of the transistor M1. The incremental gain is positive, thus this amplifier provides non-inverting amplification.

The input impedance at low frequencies is approximately $1/g_{m1}$, which is too low for applications where the source resistance $R_S$ is not very small. As can be seen in Equation (5), the incremental gain is reduced by a factor of $1+g_{m1}R_S$ compared with that of the CS amplifier in FIG. 1.

As in the CS amplifier, the output resistance of the CG amplifier is approximately the same as the load resistor $R_L$:

$$R_o \approx R_L \quad (6)$$

Therefore, the CG amplifier's gain will be reduced if any resistive load is presented at the output. For example, if load resistance $R_1$ is attached between the output and the incremental ground, the corresponding incremental gain is further reduced to $$a_v \approx \frac{g_{m1}(R_L \| R_1)}{1+g_{m1}R_S} \quad (7)$$

Thus, unless $R_1$ is much larger than $R_L$, the incremental gain is substantially reduced.

The power supply rejection ratio of the CG amplifier in FIG. 2 is also shown to be approximately same as the incremental gain because the power supply noise couples to the output without attenuation as with the amplifier 20 in FIG. 1:

$$PSRR \approx \frac{g_{m1}R_L}{1+g_{m1}R_S} \quad (8)$$

Due to the lower incremental gain of the CG amplifier compared with that of a CS amplifier, the PSRR of the CG amplifier is often too low to be acceptable.

Figure 3:
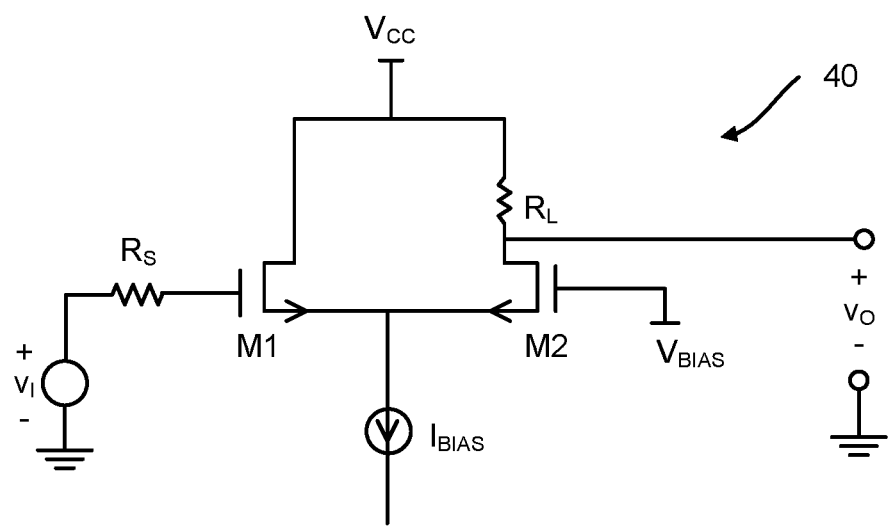
FIG. 3 (prior art) provides an illustration of a prior art source-coupled amplifier.

FIG. 3 provides an illustration of a prior art source-coupled amplifier circuit 40 with a load resistor $R_L$ and a source resistance $R_S$. In effect, the SF comprising M1 drives the CG amplifier comprising M2 and $R_L$. The incremental gain of this circuit is shown to be $$a_v \approx \frac{g_{m1}R_L}{1+\frac{g_{m1}}{g_{m2}}} \quad (9)$$

where $g_{m1}$ and $g_{m2}$ are the transconductance of the transistor M1 and M2, respectively. The incremental gain is positive, thus this amplifier provides non-inverting amplification. The input resistance is infinite at low frequencies as in the CS amplifier of FIG. 1. The disadvantage of this amplifier is the additional power and area due to the SF, as well as extra noise contributed by the SF. Moreover, the incremental gain, as well as the PSRR, are reduced by a factor of $$1+\frac{g_{m1}}{g_{m2}}$$

compared with that of the CS amplifier.

Figure 4A:
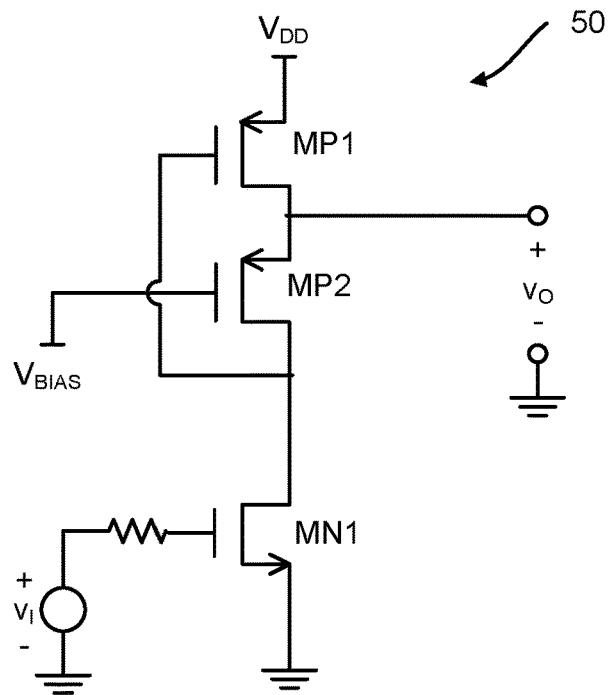
FIG. 4A illustrates an example of an amplifier according to one embodiment of the present invention with an NMOS input transistor and PMOS load and feedback transistors.

FIG. 4A shows an embodiment of an amplifier 50 according to the present invention. As in the prior art amplifier 20 in FIG. 1, an NMOS transistor MN1 constitutes the input transistor. A PMOS transistor MP2 functions as a load transistor, and the PMOS transistor MP1 functions as a feedback transistor. The bias voltage $V_{BIAS}$ is preferably referenced to the ground potential independent of the power supply, and adjusted in such way to bias all transistors in the saturation region. A negative feedback loop from the gate of MP1 to the drain of MP2, and back to the gate of MP1 adjusts the gate voltage of MP1 so that the drain currents of MP1 and MP2 match the drain current of MN1. The source terminal of the load transistor MP2 serves as an output of the amplifier 50.

The incremental gain of this circuit is shown to be $$a_v \approx \frac{g_{mn1}}{g_{mp2}} \quad (10)$$

where $g_{mn1}$ and $g_{mp2}$ are the transconductance of the transistor MN1 and MP2, respectively. The incremental gain is positive, thus this amplifier provides non-inverting amplification. If same voltage gain is desired as that of the CS amplifier, the transconductance $g_{mp2}$ is set to be:

$$g_{mp2} = \frac{1}{R_L} \quad (11)$$

such that $$a_v \approx g_{mn1}R_L \quad (12)$$

The input resistance is infinite at low frequencies as desired. The output resistance is given by $$R_o \approx \frac{1}{(1+g_{mp1}r_{op1})g_{mp2}} \quad (13)$$

where $g_{mp1}$ and $r_{op1}$ are the transconductance and output resistance of the transistor MP1, respectively. If $g_{mp2}$ is set according to Equation (11), the output resistance is $$R_o \approx \frac{R_L}{1+g_{mp1}r_{op1}} \quad (14)$$

Comparing with the output resistance of CS and CB amplifiers, the output resistance of the amplifier 50 is reduced by a large factor, $1+g_{mp1}r_{op1}$, making it much easier for it to drive resistive loads as well as capacitive loads.

The PSRR of the amplifier 50 is shown to be approximately $$PSRR \approx g_{mn1}(r_{on1}\|r_{op2}) \quad (15)$$

where $r_{on1}$ and $r_{op2}$ are the output resistance of the transistor MN1 and MP2, respectively. Typically, $r_{on1}\|r_{op2}$ is much larger than the load resistor $R_L$, such that the PSRR of the amplifier according the present invention is higher than that of the prior art amplifiers in FIG. 1, FIG. 2, and FIG. 3.

Figure 4B:
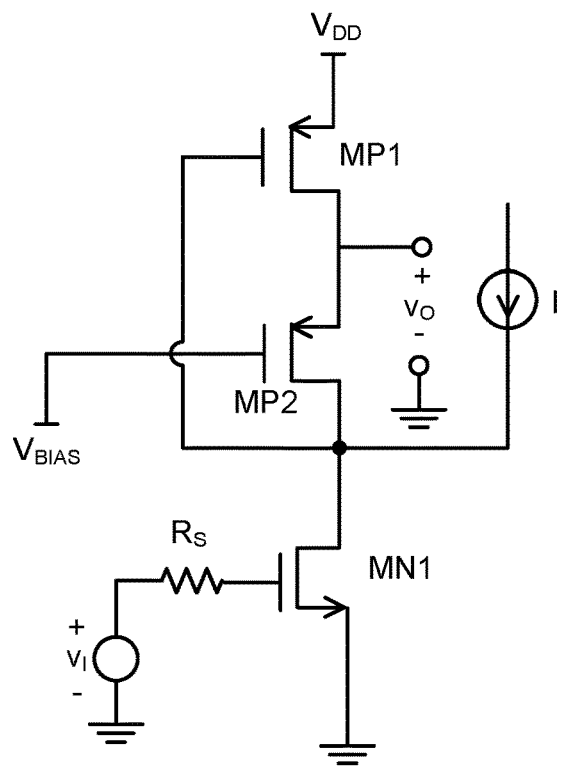
FIG. 4B illustrates an example of an amplifier according to another embodiment of the present invention with an NMOS input transistor, PMOS load and feedback transistors, and a current source.

FIG. 4B illustrates another embodiment of the present invention where a current source I provide higher bias current in the NMOS transistor MN1, thereby increasing its transconductance $g_{m1}$. As evidenced in Equations (10) and (15), higher $g_{m1}$ provides higher gain and PSRR.

For the amplifier 50 in FIG. 4A to function properly, all transistors must be biased in the saturation region. It can be shown that the output swing, which is the range of the output voltage for which both MP1 and MP2 are in the saturation region is given by $|V_{TP1}|-|(V_{GSP2}-V_{TP2})|$ where $V_{TP1}$, $V_{TP2}$, and $V_{GSP2}$ are the threshold voltages of MP1 and MP2, and the gate-to-source voltage of MP2, respectively. In order to make the output swing large, large $|V_{TP1}|$ and small $|(V_{GSP2}-V_{TP2})|$ are desired. Therefore, it may be preferred to employ a device type that offers the high threshold voltage for MP1. The gate length of MP1 may also be chosen to maximize its threshold voltage. Reverse back-gate biasing may be employed to further increase the threshold voltage of MP1.

Figure 5A:
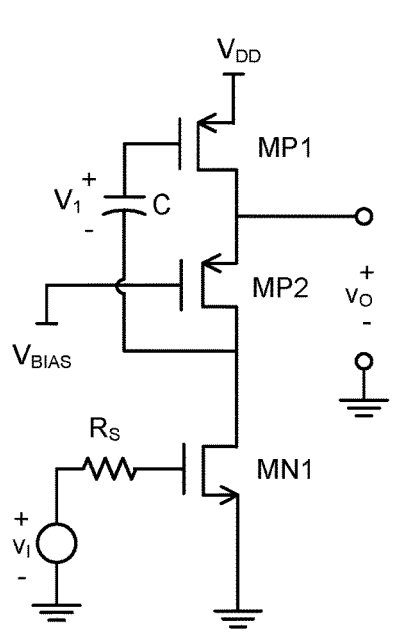
FIG. 5A illustrates an example of an amplifier according to another embodiment of the present invention, which further includes a level shifting circuit implemented using a capacitor pre-changed to a predetermined voltage.
Figure 5B:
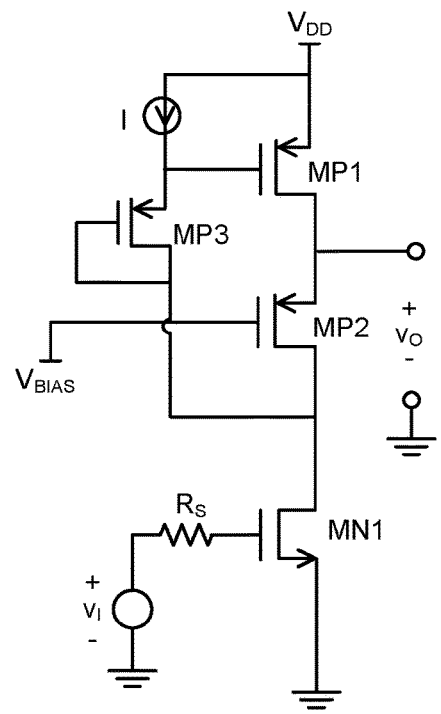
FIG. 5B illustrates an example of an amplifier according to another embodiment of the present invention, which further includes a level shifting circuit implemented by a PMOS transistor and a current source.
Figure 5C:
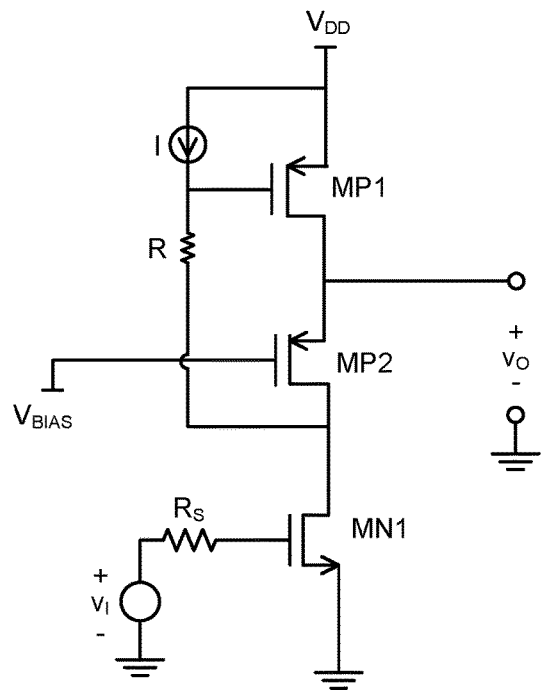
FIG. 5C illustrates an example of an amplifier according to another embodiment of the present invention, which further includes a level shifting circuit implemented by a resistor and a current source.

In some applications, it may be beneficial to insert a level shifting voltage between the drain of MP2 and the gate of MP1 to further increase the output swing. A variety of level shifting method, for example, using a pre-charged capacitor, may be employed. The output swing increases by the level shift amount. FIG. 5A shows a level shifting circuit implemented by a capacitor charged to a predetermined voltage $V_1$. FIG. 5B shows a level shifting circuit implemented using a PMOS transistor MP3 and a current source $I_1$. The gate-to-source voltage of MP3 determines the level shift amount. FIG. 5C shows a level shifting circuit implemented by a resistor $R_1$ and a current source $I_2$, where the level shift amount is $I_1 R_1$.

Since there is only a single leg of the circuit that the bias current flows through, the power consumption of the amplifier 50 in FIG. 4A is comparable to that of the CS amplifier in FIG. 1. In addition, it can be shown that the input referred noise is comparable to the CS amplifier if the incremental gain is made to be the same. Therefore there is no power or noise penalty in the amplifier circuit of FIG. 4, and the area penalty of the additional transistor is small.

Figure 6:
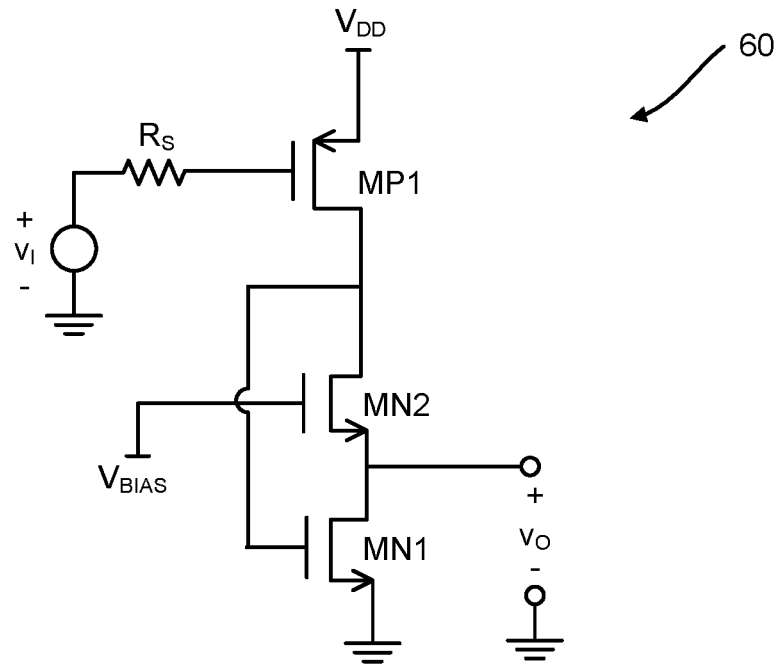
FIG. 6 illustrates an example of an amplifier according to another embodiment of the present invention, with a PMOS input transistor and NMOS load and feedback transistors.

FIG. 6 shows another embodiment of the present invention. It is a "flipped" version of the amplifier 50 in FIG. 4A, having a PMOS input transistor MP1 and an NMOS load transistor MN2, and an NMOS feedback transistor MN1. Except for the flipped topology, the properties of the amplifier 60 are similar to those of the amplifier 50.

Figure 7:
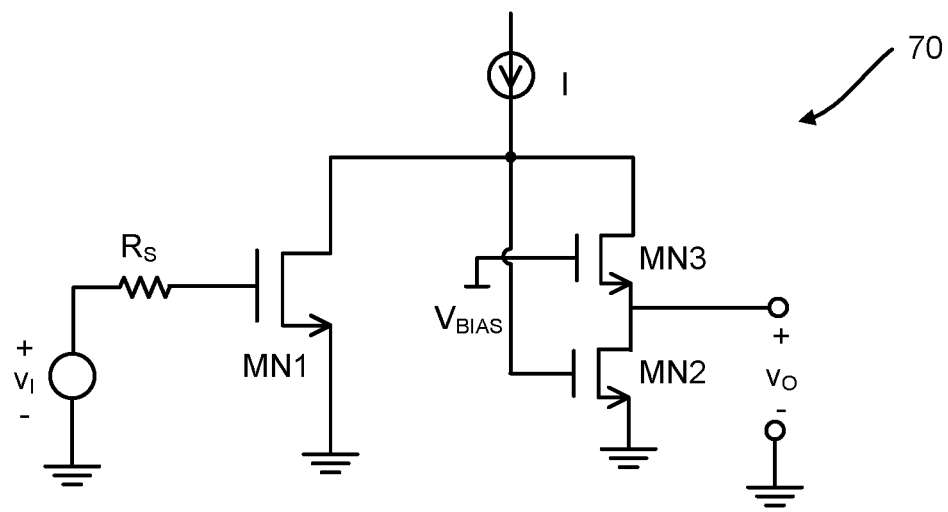
FIG. 7 illustrates an example of an amplifier according to another embodiment of the present invention, with an NMOS input transistor and NMOS load and feedback transistors.

FIG. 7 shows another embodiment of the present invention. It is a "folded" version of the amplifier 50 in FIG. 4A, having NMOS input transistor MN1 and an NMOS load transistor MN3 and NMOS feedback transistor MN2. The current source $I_1$ supplies the bias currents for all transistors MN1, MN2, and MN3. Except for the NMOS input transistor instead of a PMOS input transistor, the amplifier 70 functions similarly to the amplifier 60 in FIG. 6.

Figure 8:
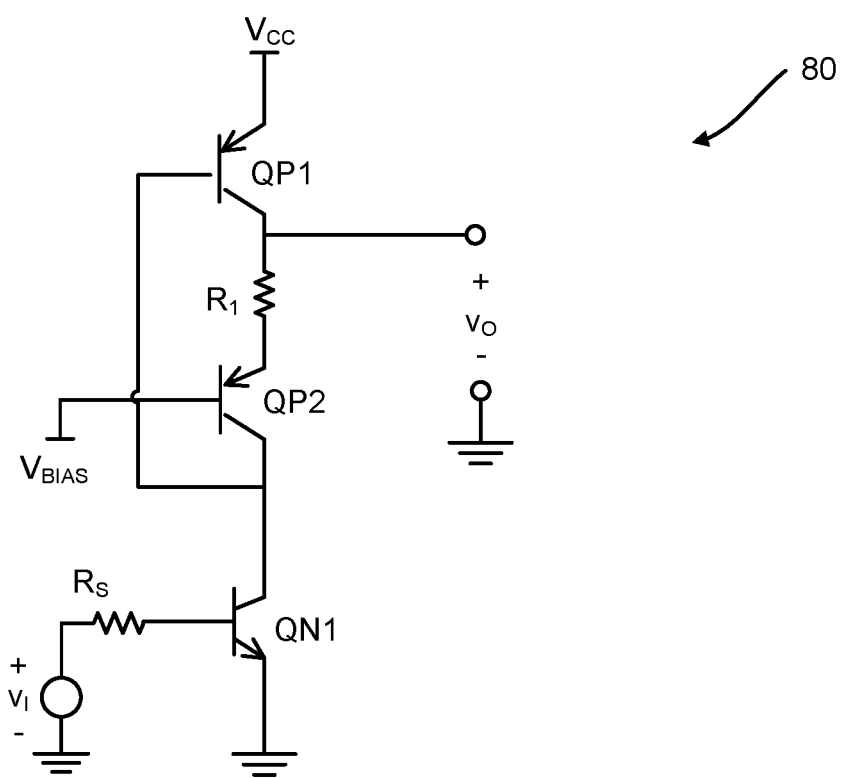
FIG. 8 illustrates an example of an amplifier according to another embodiment of the present invention, with an NPN input transistor and PNP load and feedback transistors.

FIG. 8 shows an embodiment of the present invention using bipolar transistors. An NPN transistor QN1 constitutes the input transistor. A PNP transistor QP1 functions as the feedback transistor, and a PNP transistor QP2 functions as the load transistor. The resistor $R_1$ effectively increases gain. The bias voltage $V_{BIAS}$ is preferably referenced to the ground potential independent of the power supply, and adjusted in such way to bias all transistors in the forward active region. A negative feedback loop from the base of QP1 to the collector of QP2, and back to the base of QP1 adjusts the base voltage of QP1 so that the collector currents of QP1 and QP2 match the collector current of QN1.

The incremental gain of this circuit is shown to be $$a_v \approx g_{mn1}\left(\frac{1}{g_{mp2}} + R_1\right) \quad (16)$$

where $g_{mn1}$ and $g_{mp2}$ are the transconductance of the transistor QN1 and QP2, respectively. The incremental gain is positive, thus this amplifier provides non-inverting amplification. If same voltage gain is desired as that of a CE amplifier, the resistor $R_1$ and transconductance $g_{mp2}$ is set to be:

$$R_1 + \frac{1}{g_{mp2}} = R_L \quad (17)$$

such that $$a_v \approx g_{mn1} R_L$$

The input resistance is $r_{\pi1}$ at low frequencies as in a CE amplifier. The output resistance is given by $$R_o \approx \frac{1}{(1+\beta_{op1})}\left(\frac{1}{g_{mp2}} + R_1\right) \quad (18)$$

where $\beta_{op1}$ is the current gain of QP1, and $g_{mp1}$ and $r_{op1}$ are the transconductance and output resistance of the transistor QP1, respectively. If $R_1$ and $g_{mp2}$ are set according to Equation (17), the output resistance is $$R_o \approx \frac{R_L}{1+\beta_{op1}} \quad (19)$$

The output resistance of the amplifier 80 is reduced by a large factor, $1+\beta_{op1}$, making it much easier for it to drive resistive or capacitive loads.

The PSRR is shown to be approximately $$\text{PSRR} \approx g_{mn1}(r_{on1} \| r_{op2}) \quad (20)$$

where $r_{on1}$ and $r_{op2}$ are the output resistance of the transistor QN1 and QP2, respectively. Typically, $r_{on1} \| r_{op2}$ is much larger than the load resistor $R_L$, such that the PSRR of the amplifier according the present invention is higher than that of CE or CB amplifiers.

Since there is only a single leg of the circuit that the bias current flows through, the power consumption is comparable to that of a CE amplifier. 1. In addition, it can be shown that the input referred noise is comparable to the CE amplifier if the incremental gain is made to be the same. Therefore, there is no power or noise penalty in the amplifier circuit of FIG. 8, and the area penalty of the additional transistor is small.

Figure 9A:
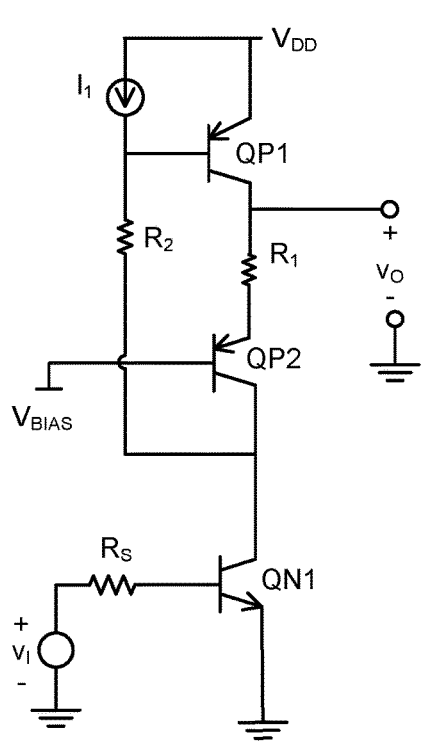
FIG. 9A illustrates an example of an amplifier according to another embodiment of the present invention, with an NPN input transistor and PNP load and feedback transistors, further including a level shifting circuit implemented by a resistor and a current source.
Figure 9B:
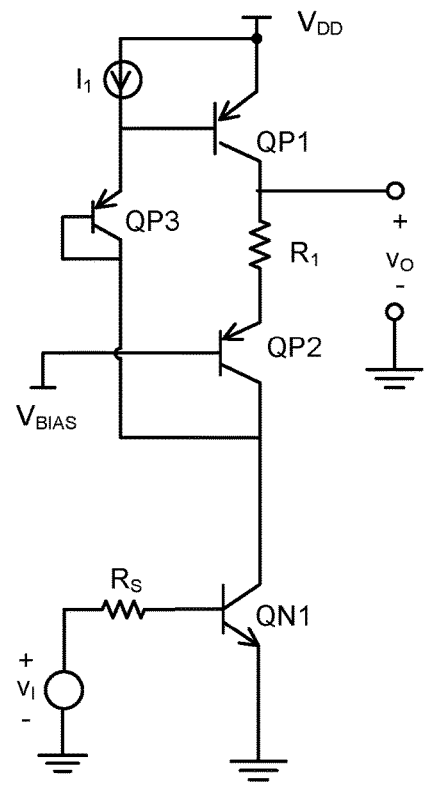
FIG. 9B illustrates an example of an amplifier according to another embodiment of the present invention, with an NPN input transistor and PNP load and feedback transistors, further including a level shifting circuit implemented by an NPN transistor and a current source.
Figure 9C:
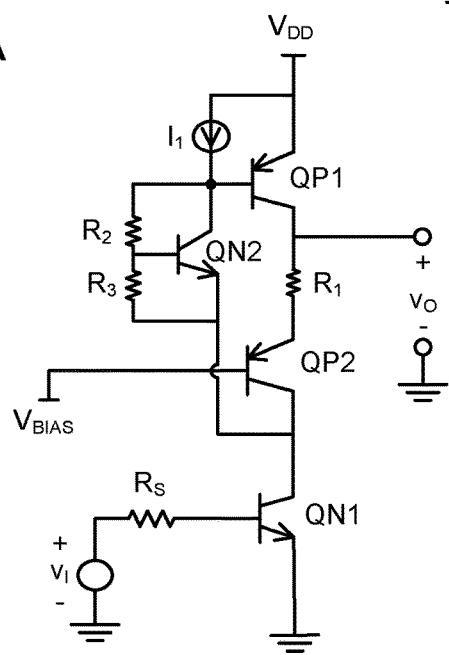
FIG. 9C illustrates an example of an amplifier according to another embodiment of the present invention, with an NPN input transistor and PNP load and feedback transistors, further including a level shifting circuit implemented by an VBE multiplier.

For the amplifier 80 to function properly, all transistors must be biased in the forward active region. In some applications, it may be beneficial to insert a level shifting voltage between the collector of QP2 and the base of QP1 to increase the output swing. The output swing increases by the level shift amount. A variety of level shifting method, for example, using a resistor, may be employed. FIG. 9A shows a level shifting circuit implemented by a resistor $R_2$ and a current source $I_1$, where the level shift amount is $I_1 R_2$. FIG. 9B shows a level shifting circuit implemented using a PNP transistor QP3 and a current source $I_1$. The base-to-emitter voltage of QP3 determines the level shift amount. FIG. 9C shows a level shifting circuit implemented by a $V_{BE}$ multiplier. The level shift amount is given by $$V_1 = \frac{R_2 + R_3}{R_2} V_{BEn2} \quad (21)$$

where $V_{BEn2}$ is the base-to-emitter voltage of the transistor QN2.

In cases where the base current of the transistor QP1 is large enough, the current source $I_1$ may be omitted in the level shifting circuits shown in FIG. 9A, FIG. 9B, and FIG. 9C.

Figure 10:
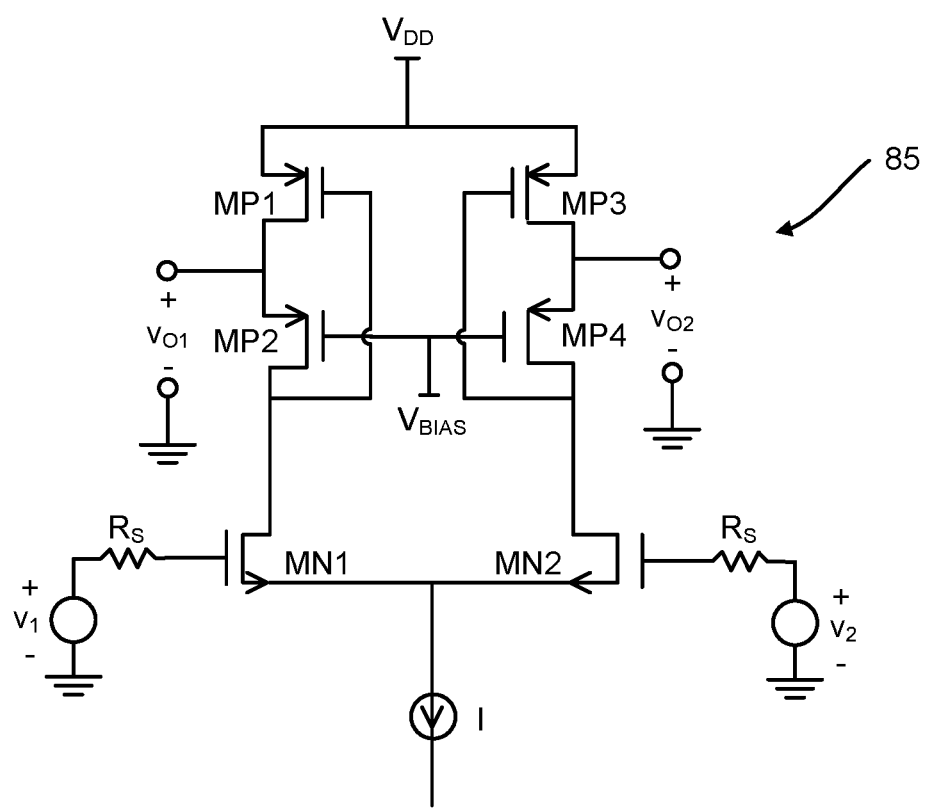
FIG. 10 illustrates an example of a differential amplifier according to another embodiment of the present invention with an NMOS input transistors and PMOS load and feedback transistors.

FIG. 10 illustrates another embodiment of the present invention in a differential amplifier 85. The NMOS transistors MN1 and MN2 form the input differential pair. The PMOS transistors MP1 and MP3 function as the feedback transistors, and MP2 and MP4 function as the load transistors. The bias voltage VBIAS is preferably referenced to the ground potential for higher PSRR.

A negative feedback loop from the gate of MP1 to the drain of MP2, and back to the gate of MP1 adjusts the gate voltage of MP1 so that the drain currents of MP1 and MP2 match the drain current of MN1. Likewise, another negative feedback loop from the gate of MP3 to the drain of MP4, and back to the gate of MP3 adjusts the gate voltage of MP3 so that the drain currents of MP3 and MP4 match the drain current of MN4. The outputs are obtained from the source terminals of the load transistors MP2 and MP4.

The differential incremental gain of this circuit is shown to be $$a_{vd} = \frac{v_{od}}{v_{id}} \approx \frac{g_{mn1}}{g_{mp2}} = \frac{g_{mn2}}{g_{mp4}} \quad (22)$$

where the differential input and output voltages $v_{id}$ and $v_{od}$ are defined as $$v_{id} = v_1 - v_2$$

$$v_{od} = v_{o1} - v_{o2}$$

Also, $g_{mn1}$ and $g_{mp2}$ are the transconductance of the transistor MN1 and MP2, respectively, and $g_{mn2}$ and $g_{mp4}$ are the transconductance of the transistor MN2 and MP4, respectively. The incremental gain is positive, thus this amplifier provides non-inverting amplification. The input resistance is infinite at low frequencies as desired.

Since the circuit is fully-differential, the power supply noise affects both output voltages equally. For this reason, the PSRR is infinite if the two halves of the circuit are perfectly matched. In the presence of mismatch such as the threshold voltage mismatch and width or length mismatch of the devices, the amplifier 85 provides superior PSRR compared with prior art differential amplifiers for the same differential gain.

Figure 11:
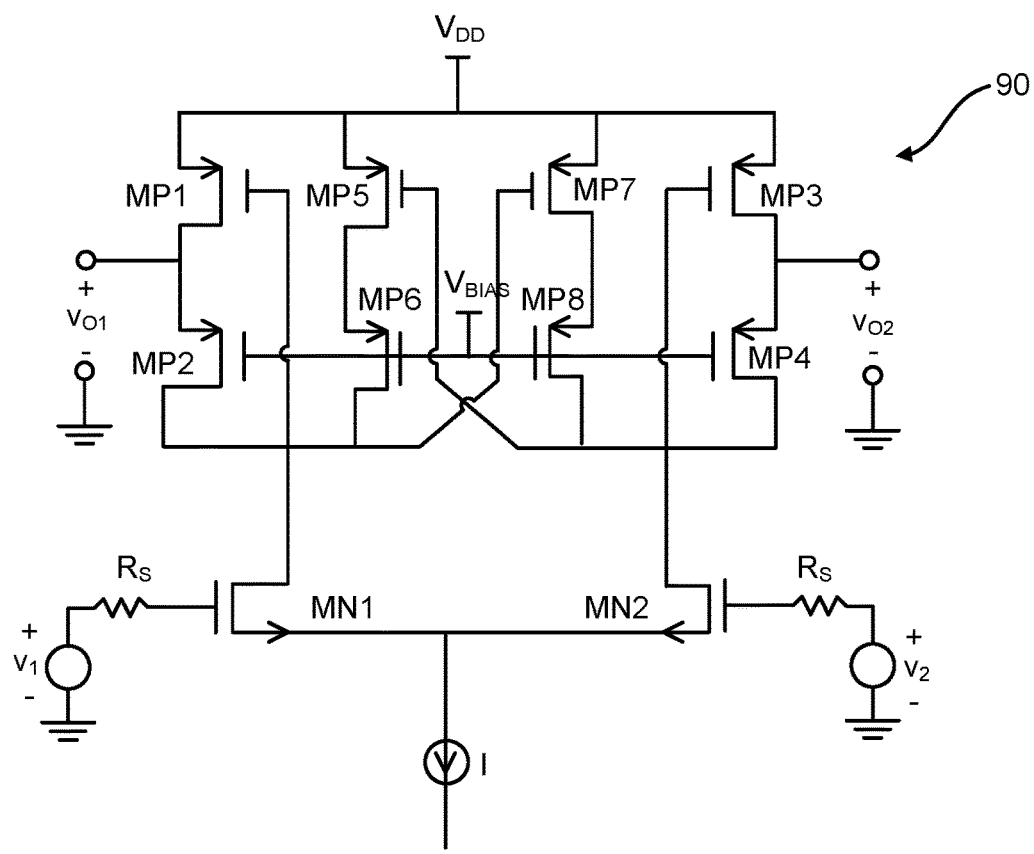
FIG. 11 illustrates an example of a differential amplifier according to another embodiment of the present invention with an NMOS input transistors, PMOS load and feedback transistors and positive feedback gain enhancement.

In some application, higher gain is desired than is provided by Equation (22). FIG. 11 illustrates another embodiment of the present invention with gain enhancement by positive feedback in an amplifier 90. The PMOS transistors MP5 and MP7 as well as cascode transistors MP6 and MP8 are added. The PMOS transistors MP5 and MP7 provide positive feedback to increase the incremental gain. The cascode transistors MP6 and MP8 keep the drain voltages of MP5 and MP7 substantially equal to those of MP1 and MP3, respectively, for better matching of operating voltages between MP1/MP3 and MP5/MP7. The source terminals of the load transistor MP2 and MP4 serve as an output of the amplifier 90.

The incremental gain of the amplifier 90 is given by $$a_{vd} = \frac{v_{od}}{v_{id}} \approx \frac{g_{mn1}}{g_{mp1} - g_{mp7}} = \frac{g_{mn2}}{g_{mp3} - g_{mp5}} \quad (23)$$

As evident in Equation (23), if the sizes of MP5/MP7 are made equal to those of MP1/MP3, and the bias voltage VBIAS1 is adjusted such that the drain currents of MP5/MP7 are made equal to those of MP1/MP3, $g_{mp1} = g_{mp3} = g_{mp5} = g_{mp7}$, and the incremental gain becomes very large.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. As a specific example, it may be desired to use PMOS input transistors in the amplifier circuits in FIG. 7, FIG. 10 and FIG. 11 instead of the NMOS input transistors as shown in the figures. Such "flipped" configurations are common and well known to those who are skilled in the art. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A non-inverting amplifier circuit providing a voltage gain comprising:
an input transistor;
a load transistor having a control terminal and a reference terminal; and
a feedback transistor;
wherein:
the input transistor receives an input signal;
the input transistor is electrically coupled to the load transistor and the feedback transistor;
the control terminal of the load transistor is electrically coupled to a bias voltage;
the feedback transistor is electrically coupled to the load transistor providing negative feedback;
the reference terminal of the load transistor serves as an output of the amplifier circuit;
the input transistor is a MOS transistor; and
the load transistor is a MOS transistor having a gate and a source, the gate corresponding to the control terminal and the source corresponding to the reference terminal.

2. The circuit of claim 1, wherein the feedback transistor has a higher threshold voltage than the load transistor.

3. A non-inverting amplifier circuit providing a voltage gain comprising:
an input transistor;
a load transistor having a control terminal and a reference terminal; and
a feedback transistor;
wherein:
the input transistor receives an input signal;
the input transistor is electrically coupled to the load transistor and the feedback transistor;
the control terminal of the load transistor is electrically coupled to a bias voltage;
the feedback transistor is electrically coupled to the load transistor providing negative feedback;
the reference terminal of the load transistor serves as an output of the amplifier circuit;
the input transistor is a bipolar transistor; and
the load transistor is a bipolar transistor having a base and an emitter, the base corresponding to the control terminal and the emitter corresponding to the reference terminal.

4. A non-inverting amplifier circuit providing a voltage gain comprising:
an input transistor;
a load transistor having a control terminal and a reference terminal;
a feedback transistor; and
a current source electrically coupled to the input transistor, the current source increasing the current through the input transistor;
wherein:
the input transistor receives an input signal;
the input transistor is electrically coupled to the load transistor and the feedback transistor;
the control terminal of the load transistor is electrically coupled to a bias voltage;
the feedback transistor is electrically coupled to the load transistor providing negative feedback; and
the reference terminal of the load transistor serves as an output of the amplifier circuit.

5. The circuit of claim 4, wherein the input transistor is a MOS transistor.

6. The circuit of claim 5, wherein the load transistor is a MOS transistor having a gate and a source, the gate corresponding to the control terminal and the source corresponding to the reference terminal.

7. The circuit of claim 6, wherein the feedback transistor has a higher threshold voltage than the load transistors.

8. A non-inverting amplifier circuit providing a voltage gain comprising:
an input transistor;
a load transistor having a control terminal and a reference terminal;
a feedback transistor; and
a level shifting circuit electrically coupled to the feedback transistor and the load transistor;
wherein:

the input transistor receives an input signal;
the input transistor is electrically coupled to the load transistor and the feedback transistor;
the control terminal of the load transistor is electrically coupled to a bias voltage;
the feedback transistor is electrically coupled to the load transistor providing negative feedback; and
the reference terminal of the load transistor serves as an output of the amplifier circuit.

9. The circuit of claim 8, wherein the level shifting circuit comprises a capacitor charged to a predetermined voltage.

10. The circuit of claim 8, wherein the level shifting circuit comprises a MOS transistor and a current source.

11. The circuit of claim 8, wherein the level shifting circuit comprises a resistor and a current source.

12. A differential amplifier circuit providing a voltage gain comprising:
a first input transistor;
a second input transistor;
at least one load transistor having a control terminal and a reference terminal; and
at least one feedback transistor;
wherein:
the first and the second input transistors receive an input signal;
the first input transistor is electrically coupled to the at least one load transistor and the at least one feedback transistor;
the control terminal of the at least one load transistor is electrically coupled to a bias voltage;
the at least one feedback transistor is electrically coupled to the at least one load transistor providing negative feedback;
the reference terminal of the at least one load transistor serves as an output of the amplifier circuit;
the input transistors are MOS transistors; and
the at least one load transistor is a MOS transistor having a gate and a source, the gate corresponding to the control terminal and the source corresponding to the reference terminal.

13. The circuit of claim 12, wherein the at least one feedback transistor has a higher threshold voltage than the at least one load transistor.

14. A differential amplifier circuit providing a voltage gain comprising:
a first input transistor;
a second input transistor;
at least one load transistor having a control terminal and a reference terminal; and
at least one feedback transistor;
wherein:
the first and the second input transistors receive an input signal;
the first input transistor is electrically coupled to the at least one load transistor and the at least one feedback transistor;
the control terminal of the at least one load transistor is electrically coupled to a bias voltage;
the at least one feedback transistor is electrically coupled to the at least one load transistor providing negative feedback;
the reference terminal of the at least one load transistor serves as an output of the amplifier circuit;
the input transistors are bipolar transistors; and
the at least one load transistor is a bipolar transistor having a base and an emitter, the base corresponding to the control terminal and the emitter corresponding to the reference terminal.

15. A differential amplifier circuit providing a voltage gain comprising:
a first input transistor;
a second input transistor;
at least one load transistor having a control terminal and a reference terminal;
at least one feedback transistor; and
a positive feedback transistor electrically coupled to the at least one load transistor and the at least one feedback transistor, the positive feedback transistor providing positive feedback to increase the voltage gain;
wherein:
the first and the second input transistors receive an input signal;
the first input transistor is electrically coupled to the at least one load transistor and the at least one feedback transistor;
the control terminal of the at least one load transistor is electrically coupled to a bias voltage;
the at least one feedback transistor is electrically coupled to the at least one load transistor providing negative feedback;
the reference terminal of the at least one load transistor serves as an output of the amplifier circuit.

* * * * *